United States Patent [19]

Moroney et al.

[11] Patent Number: 5,771,239
[45] Date of Patent: Jun. 23, 1998

[54] METHOD AND APPARATUS FOR MODIFYING A TRANSPORT PACKET STREAM TO PROVIDE CONCATENATED SYNCHRONIZATION BYTES AT INTERLEAVER OUTPUT

[75] Inventors: Paul Moroney, Olivenhain; Mark S. Schmidt, San Diego, both of Calif.

[73] Assignee: General Instrument Corporation of Delaware, Chicago, Ill.

[21] Appl. No.: 560,008

[22] Filed: Nov. 17, 1995

[51] Int. Cl.$^6$ ....................................... H04J 3/24
[52] U.S. Cl. .......................... 370/474; 370/391; 348/467; 348/423
[58] Field of Search .................................. 370/474, 391, 370/397, 503, 512, 476; 348/423, 465, 466, 467

[56] References Cited

U.S. PATENT DOCUMENTS

| | | | |
|---|---|---|---|
| 5,517,250 | 5/1996 | Hoogenboom et al. | 348/467 |
| 5,583,562 | 12/1996 | Birch et al. | 370/391 |
| 5,598,415 | 1/1997 | Nuber et al. | 370/474 |

OTHER PUBLICATIONS

"Baseline Specification for the European System for Broadcasting Digital Television, Sound, and Data Services by Satellite in the 11/12 GHz Bands, and the CATV Cable and SMATV Distribution of Corresponding Digital Services," Digital Video Broadcasting, c/o European Broadcasting Union, Geneva, Switzerland, DVB SB 5 (94) 5, Mar. 2, 1994, pp. 1–38.

*Primary Examiner*—Douglas W. Olms
*Assistant Examiner*—Shick Hom
*Attorney, Agent, or Firm*—Barry R. Lipsitz

[57] ABSTRACT

An MPEG transport packet stream or the like is modified to provide concatenated synchronization bytes at an output of an interleaver receiving the modified packet stream. A conventional sync byte located in a first transport packet is replaced with a first substitute sync byte. A conventional sync byte located in a conventional sync byte position of a second transport packet is deleted. Another byte from the second transport packet is moved to the position of the deleted sync byte to open a desired byte position in the second transport packet. A second substitute sync byte is inserted into the desired byte position. The first and second transport packets and the desired byte position are selected to provide the first and second substitute sync bytes at locations in the modified packet stream where the first substitute sync byte will be concatenated with the second substitute sync byte at the output of the interleaver. The transport packet stream can be further modified to provide concatenated auxiliary bytes at the output of the interleaver.

23 Claims, 7 Drawing Sheets

| FIG. 3a |
|---------|
| FIG. 3b |

METHOD AND APPARATUS FOR MODIFYING A TRANSPORT PACKET STREAM TO PROVIDE CONCATENATED SYNCHRONIZATION BYTES AT INTERLEAVER OUTPUT

BACKGROUND OF THE INVENTION

The present invention relates to digital communication such as the transport of digital television signals, and more particularly to the synchronization of a convolutional interleaver/deinterleaver and pseudo noise randomizer/derandomizer via reordered synchronization byte insertion in an otherwise standard transport packet. The invention is particularly applicable to the reordering of transport packets conforming to the Motion Picture Experts Group (MPEG) data transport standard. Reordering of MPEG transport packets in accordance with the present invention provides concatenated synchronization bytes and enables the provision of concatenated "reserved" bytes useful for transporting auxiliary information in a transport stream such as a digital television stream.

Various standards have emerged for the transport of digital data, such as digital television data. Examples of such standards include the Motion Picture Experts Group standards referred to as MPEG, MPEG-1 and MPEG-2 and the DigiCipher® II standard proprietary to General Instrument Corporation of Chicago, Ill., U.S.A., the assignee of the present invention. The DigiCipher II standard is similar and inclusive of various aspects of the MPEG-2 standard, which is widely known and recognized as a video and audio compression specification sanctioned by the International Standards Organization (ISO) in Document ISO 13818.

In addition to the video and audio compression features, the MPEG-2 specification contains a systems "layer" that provides a transmission medium independent coding technique to build bitstreams containing one or more MPEG programs. The MPEG coding technique uses a formal grammar ("syntax") and a set of semantic rules for the construction of bitstreams to be transmitted. The syntax and semantic rules include provisions for multiplexing, clock recovery, synchronization and error resiliency. For purposes of this disclosure, any data stream that is coded similarly to that of an MPEG, MPEG-2 or DigiCipher II transport stream may be referred to as an "MPEG-type transport stream." One example, but by no means the only such MPEG-type transport stream, is a data stream provided in accordance with the DigiCipher II standard. Other such standards are expected to be promulgated in the future.

The MPEG-type transport stream is specifically designed for transmission in conditions that can generate data errors. MPEG transport packets each have a fixed length of 188 bytes. Many programs, each with different components, may be combined in a transport stream. Examples of services that can be provided using the MPEG format are television services broadcast over terrestrial, cable television and satellite networks as well as interactive telephony-based services. The syntax and semantics of the MPEG-2 transport stream are defined in the International Organisation for Standardisation, ISO/IEC 13818-1, International Standard, 13 Nov. 1994 entitled "Generic Coding of Moving Pictures and Associated Audio: Systems," recommendation H.222.0, and ISO/IEC 13818-2, International Standard, 1995 entitled "Generic Coding of Moving Pictures and Associated Audio: Video," recommendation H.262, both incorporated herein by reference.

The transport of video and audio according to the MPEG standard is accomplished by packaging raw elementary streams such as coded video and audio into packetized elementary stream (PES) packets which are then inserted into transport packets. Each PES packet includes a PES header followed by a payload. The packetized audio and video may be combined with other information to form fixed length MPEG transport packets of 188 bytes in length. The first byte is a synchronization byte having a unique eight-bit pattern, e.g., 01000111. The sync byte is used to locate the beginning of each transport packet.

In order to reconstruct a television signal from the video and audio information carried in an MPEG-type (e.g., MPEG-2 or DigiCipher II) transport stream, a decoder is required to process the video packets for output to a video decompression processor (VDP) and the audio packets for output to an audio decompression processor (ADP). It is also possible to transmit other types of data in such a transport stream. For example, private data to provide services such as teletext, stock quotes and other information can be carried as separate transport packets.

The communication of digital signals will invariably result in transmission errors, even in systems designed to reduce the frequency of occurrence of such errors. The errors are caused by many well known factors, including noise and other imperfections in the transmission channel.

In order to cope with transmission errors, error correcting codes such as block codes have been developed. A block code is a mapping of K input binary symbols into L output binary symbols. Since L is greater than K, the code can be selected to provide redundancy, such as parity bits, which are used by a decoder to provide some error detection and error correction ability. The design and implementation of error correcting codes is well known in the art, and a discussion of the subject can be found in G. C. Clark and J. B. Cain, "Error-Correction Coding for Digital Communications," Plenum Press, New York, 1981.

Any error correcting code is limited by the number of consecutive errors that it can detect and/or correct. Thus, "burst errors" comprising a relatively large number of consecutive errors are particularly troublesome for a digital communication system. A solution to the burst error problem is to interleave the data to be communicated prior to transmission such that a burst error affecting a succession of interleaved data symbols will be spread apart when the symbols are deinterleaved at a receiver. Thus, by interleaving an encoder output sequence prior to transmission and deinterleaving the sequence prior to decoding, burst errors are distributed more uniformly at the decoder input. Burst can also be caused when using "concatenated codes," wherein covolutional codes are concatenated with block codes. An interleaver is also useful in reducing the effects of such bursts at the convolutional decoder.

An interleaver is a device that rearranges (or permutes) the ordering of a sequence of symbols in a deterministic manner. The corresponding deinterleaver at the receiver applies the inverse permutation to restore the sequence of transmitted symbols to its original order. Such interleavers are typically placed externally with respect to the coder/decoder circuits used for error detection and correction. However, certain decoder structures are known in which interleaving can be applied internally in a very simple fashion. An example is a Meggitt-type decoder structure.

One class of interleavers is known as periodic interleavers, for which the interleaving permutation is a periodic function of time. Examples are block interleavers, which accept symbols in blocks and perform identical permutations over each block of symbols, and convolutional interleavers which have no fixed block structure, but perform a periodic permutation over a semi-infinite sequence of coded symbols. A block interleaver typically takes the coded symbols and writes them by columns into a matrix with N rows and B columns. The permutation consists of reading these symbols out of the matrix by rows prior to transmission. Such an interleaver is referred to as a (B, N) block interleaver. The deinterleaver performs the inverse operation. Symbols are written into the deinterleaver by rows and read out by columns. Such interleavers are easily implemented with well known digital technology.

In convolutional interleavers, coded symbols are shifted sequentially into a bank of B registers with increasing lengths. With each new code symbol, a commutator switches to a new register and the new code symbol is shifted in while the oldest code symbol in that register is shifted out to the transmission channel. The input and output commutators operate synchronously. The deinterleaver has a similar structure and performs the inverse operation. It will be appreciated that for proper deinterleaving the deinterleaver commutator must be synchronized with the interleaver commutator. The implementation of such an interleaver can be done with a random access memory, rather than with shift registers, simply by implementing the appropriate control of memory access.

In various known transport schemes, such as that defined by the MPEG transport standard, each successive packet includes a synchronization byte (typically eight bits) as the first byte of the packet. The synchronization byte is used by the decoder to obtain synchronization with the encoder. Such synchronization may be used for acquisition and tracking of the signal at the decoder, synchronization of the deinterleaver at the decoder with the interleaver at the encoder, synchronization of the forward error correction (FEC) circuitry at the decoder, and/or the synchronization of any other receiver component. Although the eight-bit synchronization byte provided in conventional transport schemes such as MPEG is generally adequate, it may be possible to achieve a more robust performance using a larger synchronization word, such as one formed by concatenating two eight-bit bytes. It also may not be necessary to resynchronize with every packet. Thus, the provision of a synchronization byte at the beginning of each packet, as set forth in the MPEG specification, may be redundant for various applications. In particular, where a sixteen-bit synchronization word is provided, it is possible to spread out resynchronization among a plurality of packets. As an example, one sixteen-bit synchronization word every twelve transport packets has been found to be adequate. By providing a synchronization byte at the beginning of each transport packet, valuable bandwidth is wasted.

It would be advantageous to provide a method and apparatus for modifying conventional transport packets, such as MPEG packets, to provide concatenated synchronization words at the output of the interleaver used at the encoder, the concatenated synchronization words providing twice the number of bits as a conventional sync byte. It would be further advantageous to modify the conventional transport packets such that a portion of the bandwidth used up by conventional sync bytes at the beginning of each packet is made available for transporting auxiliary information. It would be still further advantageous to provide for the randomization of such a modified transport stream after the interleaving process, without randomizing the concatenated sync bytes that are necessary to acquire and track the signal at the decoder. The term "randomization" as used herein does not refer to a reordering of the bits in a bitstream, but rather to the changing of the value of some of the bits by, e.g., exclusive -ORing the modified transport stream with a pseudorandom (PN) sequence. Thus, the randomization process could also be referred to as covering the input data with a random stream.

The present invention provides a method and apparatus having the aforementioned and other advantages.

SUMMARY OF THE INVENTION

In accordance with the present invention, a method is provided for modifying a transport packet stream to provide concatenated synchronization bytes at an output of an interleaver receiving the modified packet stream. A conventional sync byte located in a first transport packet is replaced with a first substitute sync byte. A conventional sync byte located in a conventional sync byte position of a second transport packet is deleted and another byte from the second transport packet is moved to the conventional sync byte position, thereby opening a desired byte position in the second transport packet. A second substitute sync byte is inserted into the desired byte position. The first and second transport packets and the desired byte position are selected in order to provide the first and second substitute sync bytes at locations in the modified packet stream where the first substitute sync byte will be concatenated with the second substitute sync byte at the output of the interleaver.

The transport packet stream can be further modified to provide concatenated auxiliary bytes at the output of the interleaver. In order to accomplish this, a conventional sync byte located in a third transport packet is replaced with a first auxiliary byte. A conventional sync byte located in a conventional sync byte position of a fourth transport packet is deleted. Another byte from the fourth transport packet is moved to the conventional sync byte position of the packet, thereby opening up a desired byte position in the fourth transport packet. A second auxiliary byte is inserted into the desired byte position of the fourth transport packet. The third and fourth transport packets and the desired byte position in the fourth transport packet are selected in order to provide the first and second auxiliary bytes at positions in the modified packet stream where the first auxiliary byte will be concatenated with the second auxiliary byte at the output of the interleaver.

In a more specific embodiment, the first and second transport packets are separated in the modified packet stream by a plurality of intervening packets. Each of the intervening packets is one of a first modified packet having an auxiliary byte directly replacing a conventional sync byte therein, a second modified packet having an auxiliary byte in a desired byte position made available by replacing the conventional sync byte of the packet with another byte from that packet, a third modified packet having a substitute sync byte directly replacing the conventional sync byte therein, or a fourth modified packet having a substitute sync byte in a desired byte position made available by replacing the conventional sync byte of the packet with another byte from that packet. Where the transport packets conform to the MPEG transport standard, the conventional sync bytes that are replaced are located at the beginning of the respective transport packet. The desired byte positions can be made available by shifting a group of N contiguous bytes immediately following the conventional sync byte in the respective transport packet by one byte. In this manner, the group will commence at the beginning of the respective transport packet, thereby opening up the desired byte position immediately following the group.

In an illustrated example embodiment, the desired byte position selected during the selection step is based on an interleaver having a depth I=12, J=19. In this example embodiment, the second transport packet precedes the first transport packet with twelve intervening packets. The first intervening packet preceding the first transport packet is one of the fourth modified packets. The second, fourth, sixth, eighth and tenth intervening packets preceding the first transport packet are each first modified packets. The third, fifth, seventh, ninth and eleventh intervening packets preceding the first transport packet are each second modified packets. The twelfth intervening packet preceding the first transport packet is one of the third modified packets. The transport packet stream can comprise a Reed-Solomon encoded MPEG transport packet stream having packets that are 204 bytes in length. In such an implementation, the desired byte positions for the I=12 and J=19 interleaver comprise the 144th byte in the respective packet.

The packet stream output from the interleaver is provided as an interleaved, modified packet stream for subsequent communication via a communication channel. Those portions of the interleaved, modified packet stream that do not include the concatenated first and second substitute sync bytes can be randomized, e.g., to prevent spoofing by identifiers contained in the packet stream. For example, an MPEG-type packet stream comprises various identifiers including packet IDs (PIDs) identifying particular data streams. The concatenated substitute sync bytes are maintained in an unrandomized condition in the otherwise randomized packet stream. The unrandomized concatenated substitute sync bytes are then available for use by a decoder in acquiring and tracking the packet stream.

A method is provided for reconstructing the transport packet stream from the randomized packet stream communicated over the communication channel. To reconstruct the transport packet stream, concatenated first and second substitute sync bytes contained therein are detected. A derandomizer and a deinterleaver are synchronized using the detected concatenated substitute sync bytes. The randomized portions of the randomized packet stream are derandomized after the synchronizing step to recover the interleaved, modified packet stream. The recovered interleaved, modified packet stream is deinterleaved to recover the modified packet stream. The substitute sync byte and first auxiliary byte in the first and third transport packets of the modified packet stream are replaced with conventional sync bytes. Bytes located in the conventional sync byte positions of the second and fourth transport packets of the modified packet stream are moved to open up the conventional sync byte positions and close the desired byte positions. Conventional sync bytes are inserted into the conventional sync byte positions opened up during the moving step. Similar methods are provided for randomizing and recovering packet streams that do not provide any concatenated auxiliary information.

Apparatus is provided for modifying a transport packet stream to provide concatenated synchronization bytes at an output of an interleaver receiving the modified packet stream. Means are coupled to receive the transport packet stream for locating particular byte positions in successive transport packets. Means responsive to the locating means replace a conventional sync byte located in a first transport packet with a first substitute sync byte. Means responsive to the locating means delete a conventional sync byte located in a sync byte position of a second transport packet and move another byte from the second transport packet to the sync byte position, thereby opening a desired byte position in the second transport packet. Means responsive to the locating means insert a second substitute sync byte into the desired byte position. The first and second transport packets and the desired byte position provide the first and second substitute sync bytes at locations in the modified packet stream where the first substitute sync byte will be concatenated with the second substitute sync byte at the output of the interleaver.

The apparatus can further comprise means responsive to the locating means for replacing a conventional sync byte located in a third transport packet with a first auxiliary byte. Means responsive to the locating means delete a conventional sync byte located in a sync byte position of a fourth transport packet and move another byte from the fourth transport packet to the sync byte position thereof. This opens up a desired byte position in the fourth transport packet. Means responsive to the locating means insert a second auxiliary byte into the desired byte position of the fourth transport packet. The third and fourth transport packets and the desired byte position in the fourth transport packet provide the first and second auxiliary bytes at positions in the modified packet stream where the first auxiliary byte will be concatenated with the second auxiliary byte at the output of the interleaver.

The desired byte positions can be made available by shifting a group of N contiguous bytes immediately following the conventional sync byte in the respective transport packet by one byte. In this manner, the group will commence at the beginning of the respective transport packet, thereby opening up the desired byte position immediately following the group. A data randomizer can be provided following the interleaver for randomizing only portions of interleaved output that do not include the concatenated first and second substitute sync bytes. The concatenated substitute sync bytes are maintained in an unrandomized condition with the randomized portions of interleaved output. Thus, the concatenated substitute sync bytes will be available at a decoder without modification for use in acquiring and tracking the packet stream.

Apparatus is provided for reconstructing an original transport packet stream with conventional sync bytes from a modified transport packet stream in which interleaved, modified transport packets provide concatenated substitute sync bytes. The apparatus includes means for detecting the concatenated substitute sync bytes in the modified transport packet stream. Means responsive to the detected concatenated substitute sync bytes synchronize a deinterleaver. The deinterleaver is coupled to deinterleave the modified transport packets. Means are provided for locating a first substitute sync byte in a conventional sync byte position of a first deinterleaved transport packet and replacing the first substitute sync byte with a conventional sync byte. A second substitute sync byte is located in a nonconventional sync byte position of a second deinterleaved transport packet and replaced with another byte from the second deinterleaved transport packet to open up a conventional sync byte position therein. Means are provided for inserting a conventional sync byte into the opened up conventional sync byte position of the second deinterleaved transport packet.

The apparatus for reconstructing the original transport packet stream can further comprise a derandomizer. The derandomizer derandomizes portions of the modified transport packet stream prior to the deinterleaver. Means are provided for synchronizing the derandomizer using the detected concatenated substitute sync bytes. The derandomizer is adapted to selectively derandomize randomized portions of the modified transport packet stream without attempting to derandomize the concatenated substitute sync bytes.

The apparatus can further comprise means for locating a first auxiliary byte in a conventional sync byte position of a third deinterleaved transport packet and replacing the first auxiliary byte with a conventional sync byte. A second auxiliary byte is located in a nonconventional sync byte position of a fourth deinterleaved transport packet. The second auxiliary byte is replaced with another byte from the fourth deinterleaved transport packet to open up a conventional sync byte position therein. Means are provided for inserting a conventional sync byte into the opened up conventional sync byte position of the fourth deinterleaved transport packet.

DETAILED DESCRIPTION OF THE INVENTION

Figure 1:
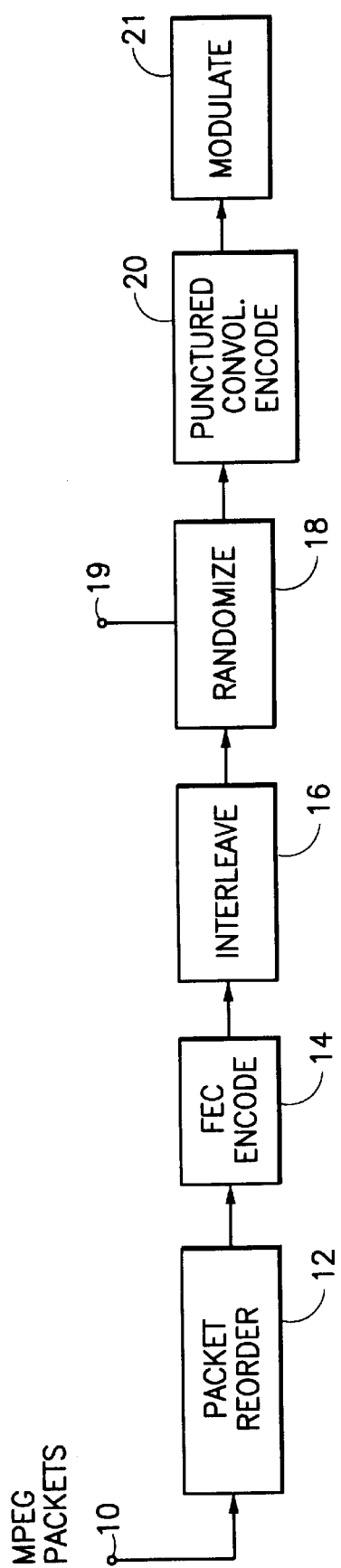
FIG. 1 is a block diagram of an encoder in accordance with the present invention.

FIG. 1 illustrates the encoder side of a communication system in which the present invention can be implemented. The components illustrated in FIG. 1 can comprise, for example, those found in a satellite television uplink. Similar components will be found in other communication systems, such as a digital cable television headend. It is anticipated that many other communication systems to be developed in the future, including multimedia transmission systems, will utilize similar encoding techniques.

MPEG-type packets (e.g., MPEG-2 or DigiCipher II transport packets) are input via terminal 10 to a packet reordering processor 12 that removes the standard MPEG sync bytes at the beginning of each transport packet and inserts substitute sync bytes and/or auxiliary information in their place. The packet reordering processor will also rearrange some of the MPEG transport packets to open a desired byte position by deleting the conventional MPEG sync byte and moving another byte from the packet to the conventional sync byte position. The packet reordering can be accomplished using a bank of conventional shift registers that shift a substitute sync or auxiliary byte into a position previously occupied by a conventional sync byte. The bank of shift registers can also shift a group of N contiguous bytes immediately following a conventional sync byte in a respective transport packet by one byte, so that the group will commence at the beginning of the respective transport packet (where the sync byte used to be), thereby opening up the desired byte position immediately following the group. Instead of using a bank of shift registers, the packet reorderer 12 can be implemented using an addressable random access memory (RAM) in which individual bytes can be replaced with different bytes in a conventional manner. In accordance with the present invention, such an addressable RAM would be used to replace sync bytes from a conventional MPEG-type transport packet with substitute sync and auxiliary bytes or with other bytes from the transport packet to open up a desired byte position for a substitute sync byte or auxiliary byte. The reordering of the MPEG-type packets is discussed in greater detail below, in connection with FIGS. 3–5.

After the packets have been reordered, they are processed by a conventional forward error correction (FEC) encoder 14. For example, Reed-Solomon coding can be used as well known in the art. The FEC encoding will add additional bytes to the transport packets to enable transmission errors to be corrected at a receiver. In the example embodiments illustrated herein, the FEC encoding adds sixteen bytes to the standard 188-byte MPEG-type packets, resulting in transport packets having a total 204 bytes.

After FEC encoding, the transport packets are interleaved in an interleaver 16. The interleaver can comprise a convolutional interleaver, which interleaves the output symbols from the FEC encoder 14. For example, the symbols can comprise eight-bit Reed-Solomon output symbols. The interleaver rearranges (i.e., permutes) the ordering of the symbols output from the FEC encoder in a deterministic manner. By interleaving the encoder output sequence prior to transmission, and deinterleaving the sequence prior to decoding, burst errors are distributed more uniformly at the decoder input, facilitating the correction of transmission errors at the receiver.

In accordance with the present invention, and as described more fully hereinafter, the packet reordering and interleaving processes are carefully designed in order to provide concatenated synchronization bytes and concatenated auxiliary information bytes at the output of the interleaver. Thus, instead of using conventional MPEG-type sync bytes, the present invention provides concatenated sync bytes which are expected to provide more robust signal acquisition and tracking at the receiver. At the same time, the present invention provides concatenated auxiliary information in bandwidth that would otherwise be used by the conventional MPEG-type sync byte provided in each transport packet.

After the symbols have been interleaved, they are randomized in a randomizer 18. Data randomization at the interleaver output is used to ensure a high data transition density for bit timing recovery purposes. Although randomization techniques are well known in the art, the present invention applies randomization in a unique manner to preserve the concatenated synchronization bytes while randomizing all of the other bytes of the transport packets.

Following randomization, the transport packets are encoded using, e.g., a punctured convolutional code as well known in the art. The convolutional encoding is provided by a punctured convolutional encoder 20 which can comprise, for example, an encoder as described in commonly assigned U.S. Pat. No. 5,396,518 to S. How entitled "Apparatus and Method for Communicating Digital Data Using Trellis Coding with Punctured Convolutional Codes." The encoded symbols output from the punctured convolutional encoder 20 are modulated using any suitable modulation technique, such as quadrature phase shift keying (QPSK), offset QPSK (OQPSK), or binary phase shift keying (BPSK).

Figure 2:
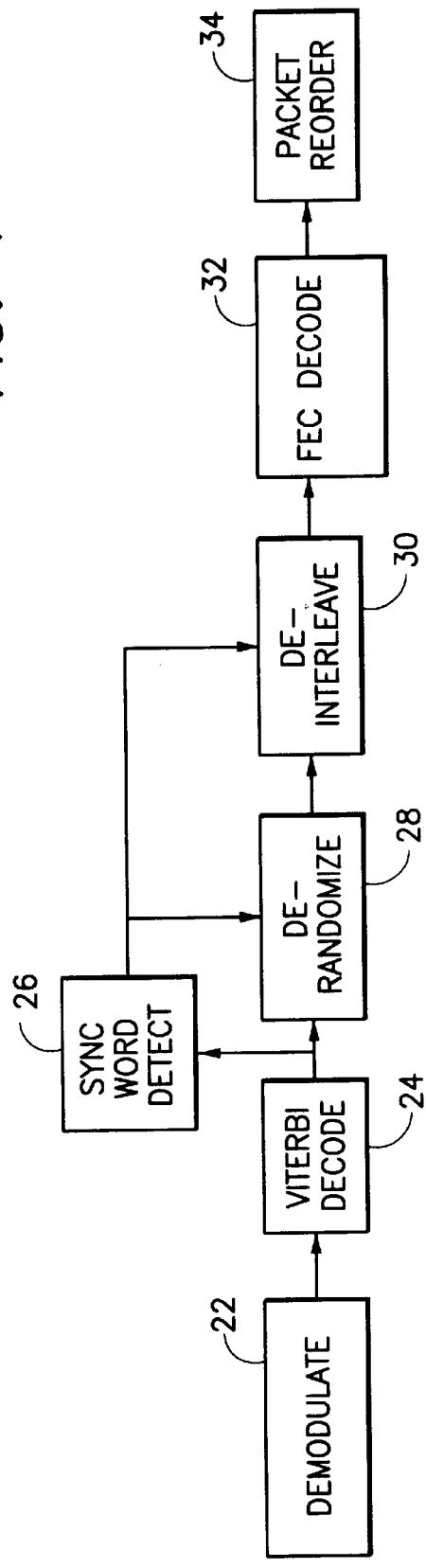
FIG. 2 is a block diagram of a decoder in accordance with the present invention.

FIG. 2 is a block diagram of the decoder components used, for example, at a satellite television downlink to recover the data transmitted by the encoder of FIG. 1. The components of FIG. 2 can also be provided in other receiver devices, such as a digital cable television receiver, multimedia receiver, or the like. The decoder includes a conventional demodulator 22, such as a QPSK, OQPSK or BPSK demodulator. The demodulated symbols are processed by a conventional Viterbi decoder to recover the interleaved, randomized FEC encoded symbols.

Once the encoded symbols have been obtained by the Viterbi decoder, the concatenated sync words contained therein in accordance with the present invention are detected by a sync word detector 26. This detector can comprise a conventional look-up table as well known in the art, or any other comparison means for locating the sync words in the incoming symbols. The detected sync words are used to initialize a derandomizer 28 and deinterleaver 30. The derandomizer provides the inverse function of randomizer 18, and outputs the derandomized symbols to deinterleaver 30. The deinterleaver provides the inverse function of interleaver 16. Where interleaver 16 is a convolutional interleaver, the deinterleaver will be a corresponding convolutional deinterleaver, as well known in the art. The deinterleaved symbols are error corrected using a conventional FEC decoder 32, such as a Reed-Solomon ("R/S") decoder. The FEC decoder will strip off the additional bytes added to the standard MPEG-type packets by the FEC encoder 14, resulting in packets of, e.g., 188 bytes in length. A packet reorderer 34 provides the inverse function of packet reorderer 12, removing the substitute sync words and auxiliary bytes and replacing them with conventional MPEG-type sync bytes at the beginning of each transport packet.

Figures 3, 3A:
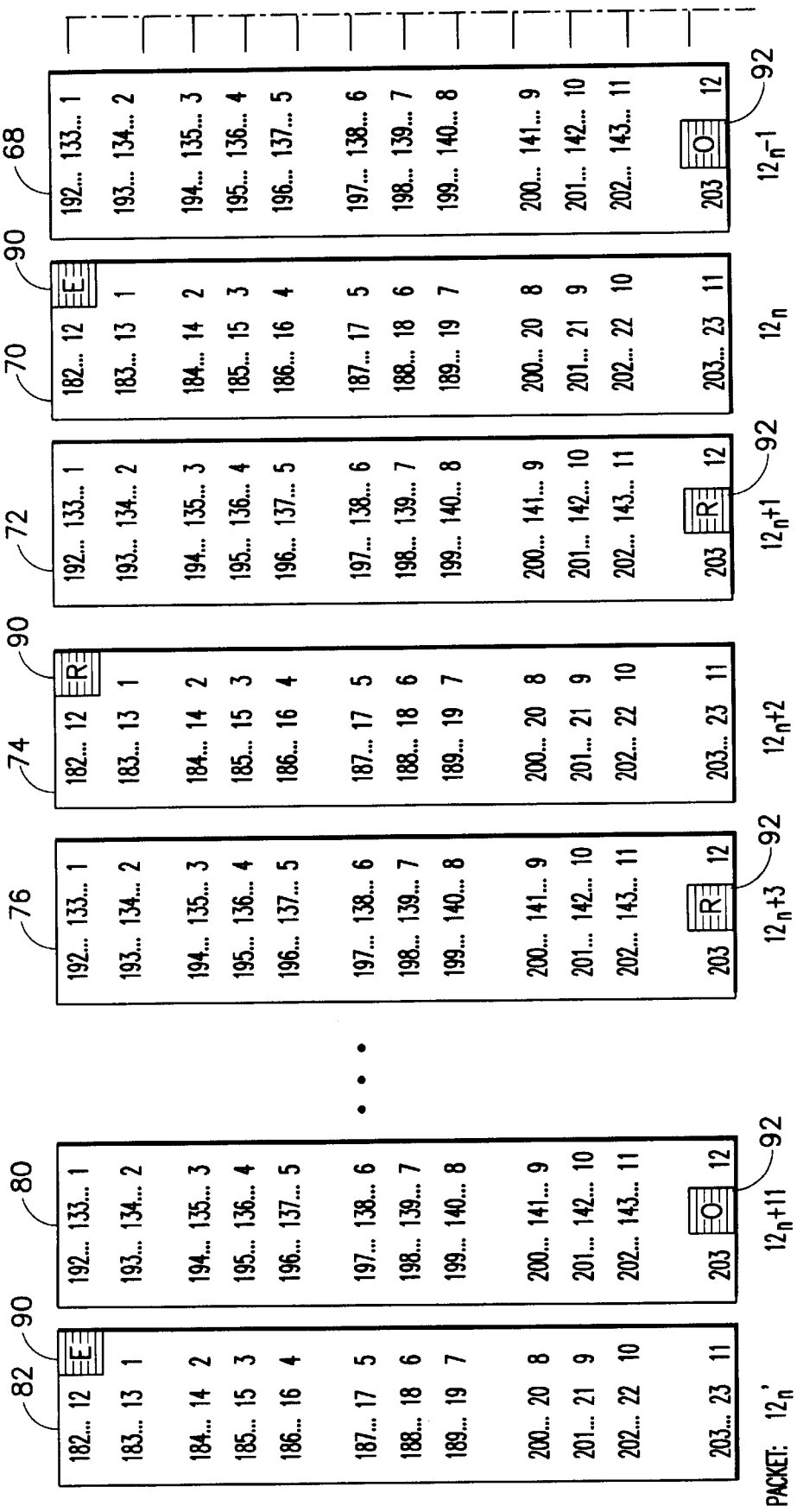
FIGS. 3a, 3b are the diagrammatic illustrations of a convolutional interleaver and a series of transport packets input thereto to illustrate the concatenation of sync bytes in accordance with the present invention.
Figure 3B:
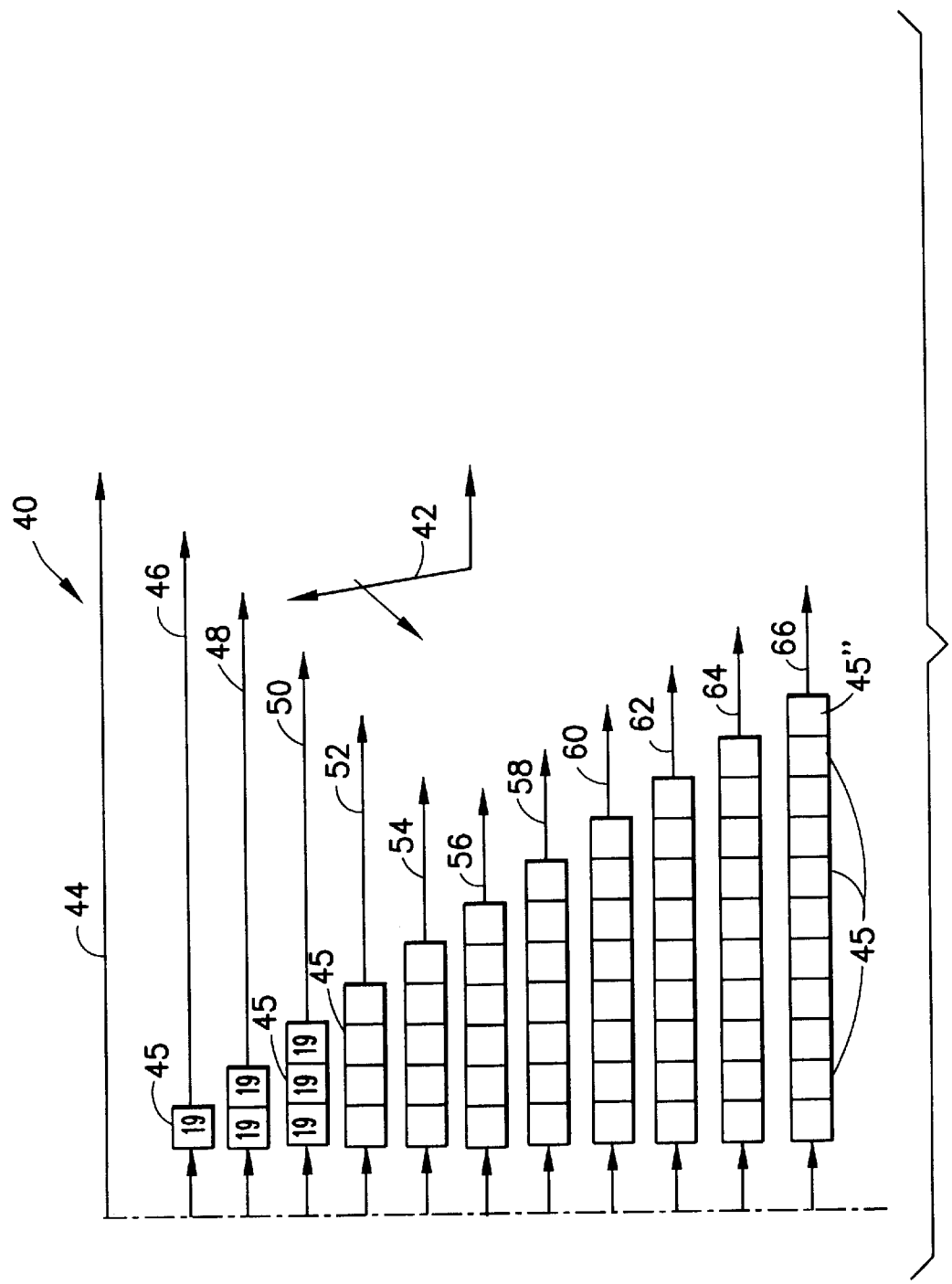

FIG. 3 illustrates the operation of a convolutional interleaver that can be used for interleaver 16 of FIG. 1. The interleaver, generally designated 40, has a depth I=12, J=19 comprising twelve commutator arms 44, 46, 48, 50, 52, 54, 56, 58, 60, 62, 64, 66. The first commutator arm 44 comprises a direct path with no delay. Each subsequent commutator arm has one more nineteen-byte delay stage than the previous commutator arm. Thus, the "$k^{th}$" commutator arm consists of k×J byte delays for k=0, 1, . . . , 11 and J=19. As illustrated in FIG. 3, the second commutator arm 46 includes one nineteen-byte delay stage 45 and the twelfth commutator arm 66 comprises eleven nineteen-byte delay stages 45. Thus, the interleaver of FIG. 3 consists of an I(I−1)J/2=1254 Reed-Solomon (RS) symbol memory. In operation, the interleaver output commutator arm 42 reads output bytes from each successive commutator branch in order from the top (arm 44) to the bottom (arm 66) and then resets to read from the zero-delay branch 44 at the commencement of the next cycle.

Alternatively, a RAM based interleaver may be implemented. In such a case, the memory size shall be I×I×J=2736 bytes numbered 0 through 2735. Such an interleaver would input symbols starting at location 0 and subsequently increment a write pointer by 229 (Modulo 2736). The interleaver would output symbols starting at location 0 and subsequently increment a read pointer by one (Modulo 2736). Each new symbol would be written before the read occurs.

In the convolutional interleaver implementation of FIG. 3, a commutator arm 42 is used to output the current byte on each successive commutator arm, one cycle at a time. Successive packets 70, 72, 74, 76, . . . 80, 82 are illustrated as being input to the interleaver. These packets have been modified in accordance with the present invention to replace the conventional MPEG-type sync byte in the first position of every twelfth packet with a first substitute sync byte ("E"—even) as illustrated at position 90 in packets 70 and 82. It should be noted that packets 70 (packet 12n) and 82 (packet 12n') are twelve packets apart in the illustrated embodiment. However, as the present invention is not limited to use of a convolutional interleaver having a depth I=12, J=19, the illustrated processing of packets in groups of twelve is only an example. The packets can be processed in groups of any other size as required by the chosen interleaver depth.

For each packet in which a first substitute sync byte has been inserted (e.g., packet 82), there will be a counterpart packet (e.g., packet 68) in which a corresponding second substitute sync byte ("O"—odd byte) has been inserted. In the example implementation of FIG. 3, there are twelve intervening packets between the counterpart packets 68 and 82, since the odd and even bytes to be concatenated are 2508 bytes (12.29411764706 packets) apart as explained below. More particularly, the second substitute sync byte is inserted at a location 92 of packet 68 such that at the output of the interleaver (i.e., commutator arm 42) the odd byte O will be concatenated with the even byte E in position 90 of packet 82. In order for this to occur, the packets 68, 82 and the byte positions 90, 92 must be properly selected.

In the example illustrated in FIG. 3, the longest commutator row 66 has eleven delay registers. Each register has nineteen bytes. Since there are twelve commutator arms, each processing the same number of bytes per cycle, after the longest row processes 11×19 bytes, each other row will have also processed 11×19 bytes. The result is that by the time a byte input to the last row 66 is output therefrom, a total of 11×19×12=2508 bytes will have been processed by the interleaver. In other words, it takes 2508 bytes to flush the interleaver.

Since there are 204 bytes per packet (188 MPEG-type bytes+16 R/S bytes), a total of 2508/204 packets (i.e., 12.29411764706 packets) are processed by the interleaver during the time it takes a byte to propagate from the beginning to the end of the longest commutator arm 66. Expressed mathematically, successive commutator arms are separated by (I×J)−1 bytes. When the odd sync byte O is in the last delay stage 45" of the last commutator arm 66, the corresponding even sync byte will appear on the next byte clock cycle at the input to the upper most commutator arm 44. The corresponding odd sync byte had been written into the interleaver:

$$(I-1)(IJ-1)+(I-1)=I^2J-IJ-(I+1)+(I-1)=IJ(I-1)$$

bytes earlier. Thus, for I=12 and J=19, IJ(I−1)=2508 bytes. This is equivalent to twelve 204-byte packets plus sixty bytes (204×0.29411764706=60).

Thus, the odd sync byte O is placed sixty bytes from the end of the transport packet 68, so that it will be properly concatenated at the interleaver output with the corresponding even sync byte E from the transport packet 82. This fact establishes that the odd sync bytes 0 must be placed in position 144 of a 204-byte packet (204−60=144).

FIG. 3 also illustrates the insertion of auxiliary or "reserved" bytes "R" in accordance with the present invention. As stated above, each MPEG-type packet will have a conventional sync byte in the first position thereof. However, it is not necessary to use every sync byte in order to provide proper acquisition, tracking and synchronization at a receiver, particularly where an expanded sync byte comprising two concatenated substitute sync bytes is used in accordance with the present invention. Therefore, auxiliary information bytes can be added to those transport packets that do not have to carry the odd and even substitute sync bytes described above.

As shown in FIG. 3, the MPEG-type sync byte provided in location 90 of packet 74 is replaced with an auxiliary byte R. Packet 72 is reordered by shifting the bytes originally in positions 2 to 144 to positions 1 to 143, with the byte previously in position 2 of the packet overwriting the MPEG-type sync byte originally found in position 1 of the packet. This opens up byte position 144 in packet 72 for the insertion of an auxiliary byte that will be concatenated with the auxiliary byte in position 90 of the thirteenth packet arriving at the interleaver after the arrival of packet 72. Similar modifications are made to the remaining transport packets between packets 70 and 80 shown in FIG. 3. Thus, in the illustrated embodiment, five pairs of concatenated auxiliary bytes can be provided between successive concatenated substitute sync bytes. This result is illustrated below in connection with the discussion of FIG. 5d.

Figure 4A:
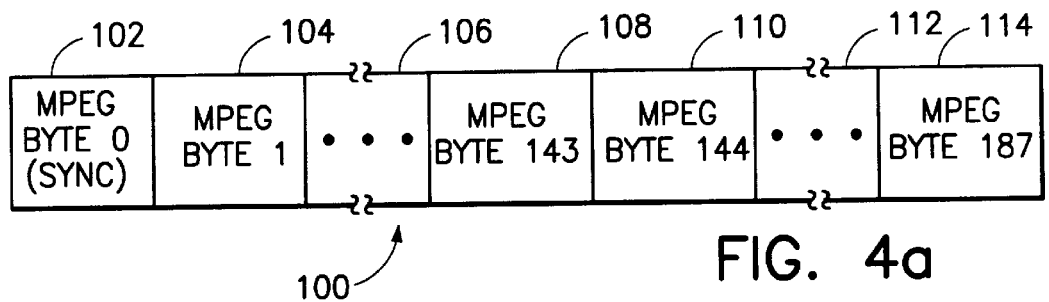
FIGS. 4a to 4c provide a diagrammatic illustration of the shifting of a group of transport packet bytes to open up a desired position in a transport packet for a substitute sync byte.
Figure 4B:
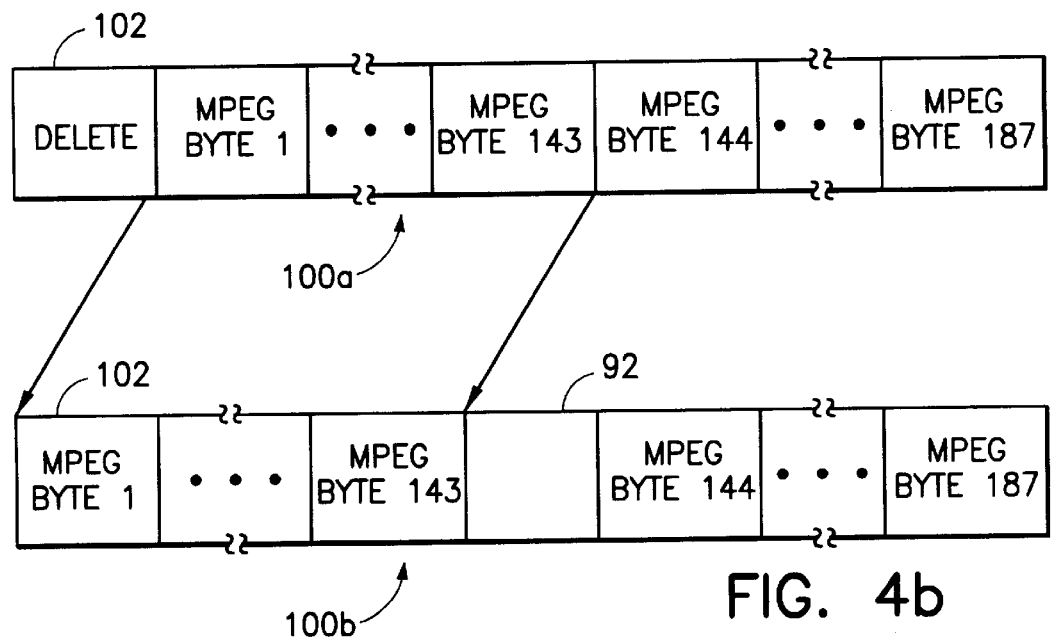
Figure 4C:
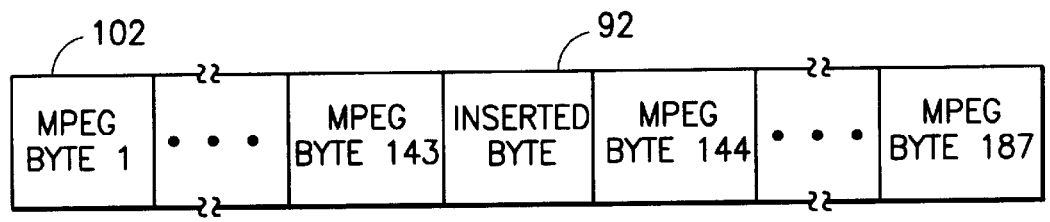

FIGS. 4a to 4c illustrate the reordering of the transport packets to accommodate the odd substitute sync bytes O and the auxiliary bytes R in position 92 (byte 144) of every other transport packet. FIG. 4a illustrates a conventional MPEG-type transport packet 100 having a sync byte 102 as the first byte of the packet, followed by 187 additional bytes designated collectively by reference numerals 104, 106, 108, 110, 112 and 114. In FIG. 4b, the sync byte in position 102 has been deleted, and bytes 1 through 143 designated by reference numeral 10a are shifted as a group to commence at location 102. Thus, as shown at 100b, byte 1 through byte 143 now occupy the portion of the transport packet previously occupied by bytes 0 through 142. This opens up the new byte position 92 between bytes 143 and 144. When the transport packet is supplemented with sixteen additional Reed-Solomon bytes to form a 204-byte packet, the opened up byte position 92 will be sixty bytes from the end of the packet. As illustrated in FIG. 4c, a new byte (either an odd substitute sync byte O or an auxiliary byte R) is inserted in byte position 92.

As indicated in the preceding discussion of FIG. 3, the bytes inserted in position 92 will be concatenated at the output of the interleaver with the bytes in position 90 of a subsequent packet. In the specific example illustrated, the "subsequent packet" will be thirteen packets later, such that the odd or reserved byte in position 92 will be concatenated with a current even or reserved byte in position 90 written into the interleaver 2508/204 packets later. This process is illustrated in greater detail in FIGS. 5a to 5d. The result is that the substitute two-byte (sixteen bit) sync pattern will appear at the Viterbi decoder output of the decoder in consecutive byte locations every twelve R/S block intervals for the depth I=12, J=19 interleaver of the illustrated embodiment.

Figure 5A:
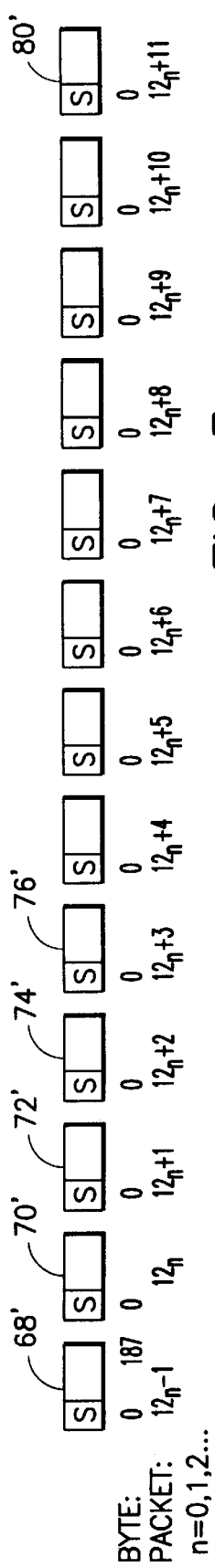
FIGS. 5a to 5d provide a diagrammatic illustration of the modification of a transport packet stream in accordance with the present invention.

FIG. 5a illustrates a sequence of thirteen transport packets input to the packet reorderer 12 of FIG. 1. As shown, packet 12n-1 designated by reference numeral 68' is a conventional MPEG-type 188-byte packet having a sync byte "S" in byte position 0, and corresponds to packet 68 of FIG. 3. The next packet 12n designated by reference numeral 70' is the packet used to form packet 70 illustrated in FIG. 3. Similarly, packet 72' is the packet used to provide packet 72 in FIG. 3. Packets 74', 76' . . . 80' are used to form packets 74, 76 . . . 80, respectively, in FIG. 3.

Figure 5B:
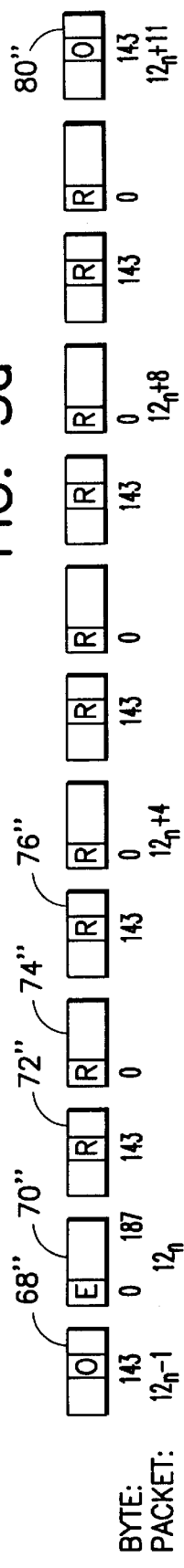

FIG. 5b illustrates the reordering of the FIG. 5a packets by packet reorderer 12. Packet 68" has been reordered to place an odd substitute sync byte "0" in byte position 143. Packet 70" has been modified to replace the conventional MPEG-type sync byte in byte position 0 with an even substitute sync byte "E". The next packet to receive an odd substitute sync byte is packet 80". As indicated, in packet 80", the odd substitute sync byte is placed in byte position 143.

Each of the intervening packets between packets 70" and 80" in FIG. 5b are modified to provide auxiliary bytes R. Packet 72" includes an auxiliary byte R in byte position 143. Packet 74" includes an auxiliary byte R in byte position 0. The remaining packets are similarly modified to carry auxiliary bytes that will ultimately be concatenated in pairs at the output of the interleaver.

Figure 5C:
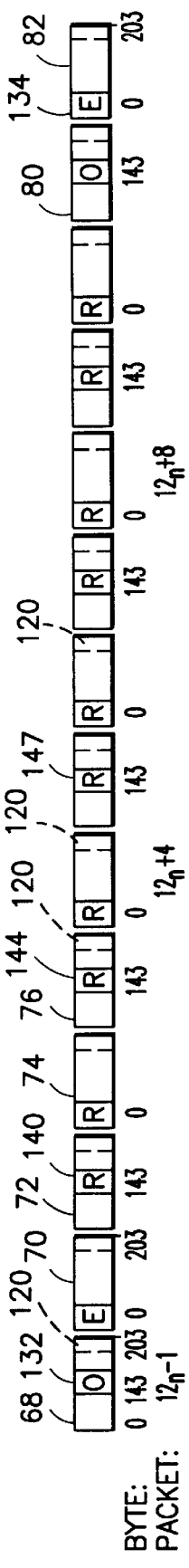
Figure 5D:
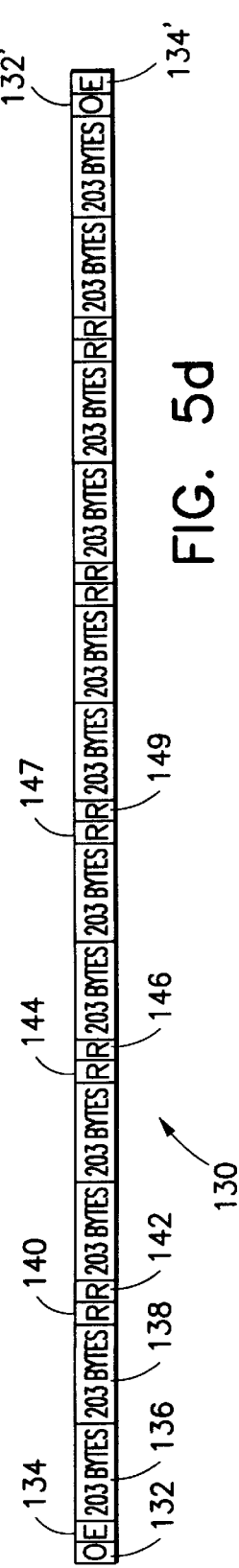

FIG. 5c illustrates the modified packets of FIG. 5b after they have been encoded by FEC encoder 14. The FEC encoder adds sixteen R/S bytes 120 to each packet. Thus, at the output of FEC encoder 14, each packet will comprise 204 bytes. The resultant packets are equivalent to packets 68, 70, 72, 74, 76 . . . 82 illustrated in FIG. 3. The operation of the interleaver will be such that the odd substitute sync byte 0 from packet 68 will be concatenated with the even substitute sync byte in byte position 0 of packet 82, since the odd sync byte of packet 68 occurs 2508/204 packets ahead of the even sync byte of packet 82. Similarly, the auxiliary byte 140 ("R") at byte position 143 of packet 72 will be concatenated with the auxiliary byte 142 at byte position 0 of the packet (not shown) which arrives thirteen packets after packet 72. This is illustrated in FIG. 5d, which shows the stream at the output of the interleaver 16. In particular, odd byte 132 is concatenated with even byte 134, followed by two groups 136, 138 of 203 bytes each. Thereafter, auxiliary byte 140 is concatenated with auxiliary byte 142. The remaining auxiliary bytes are also concatenated in pairs as illustrated, for example, at 144, 146 and 147, 149. As shown in FIG. 5d, in the illustrative embodiment five pairs of auxiliary information bytes can be provided between each consecutive pair of odd and even substitute sync bytes 132, 134 and 132', 134'.

After being output from interleaver 16, the stream 130 of FIG. 5d will be input to randomizer 18. In order to enable the use of the concatenated substitute sync bytes at a receiver, it is important to disable the randomizer during the time that the concatenated substitute sync bytes 132, 134; 132', 134'; . . . would otherwise be randomized. This can be accomplished, for example, by providing the randomizer with a disable input 19 as indicated in FIG. 1.

Figure 6:
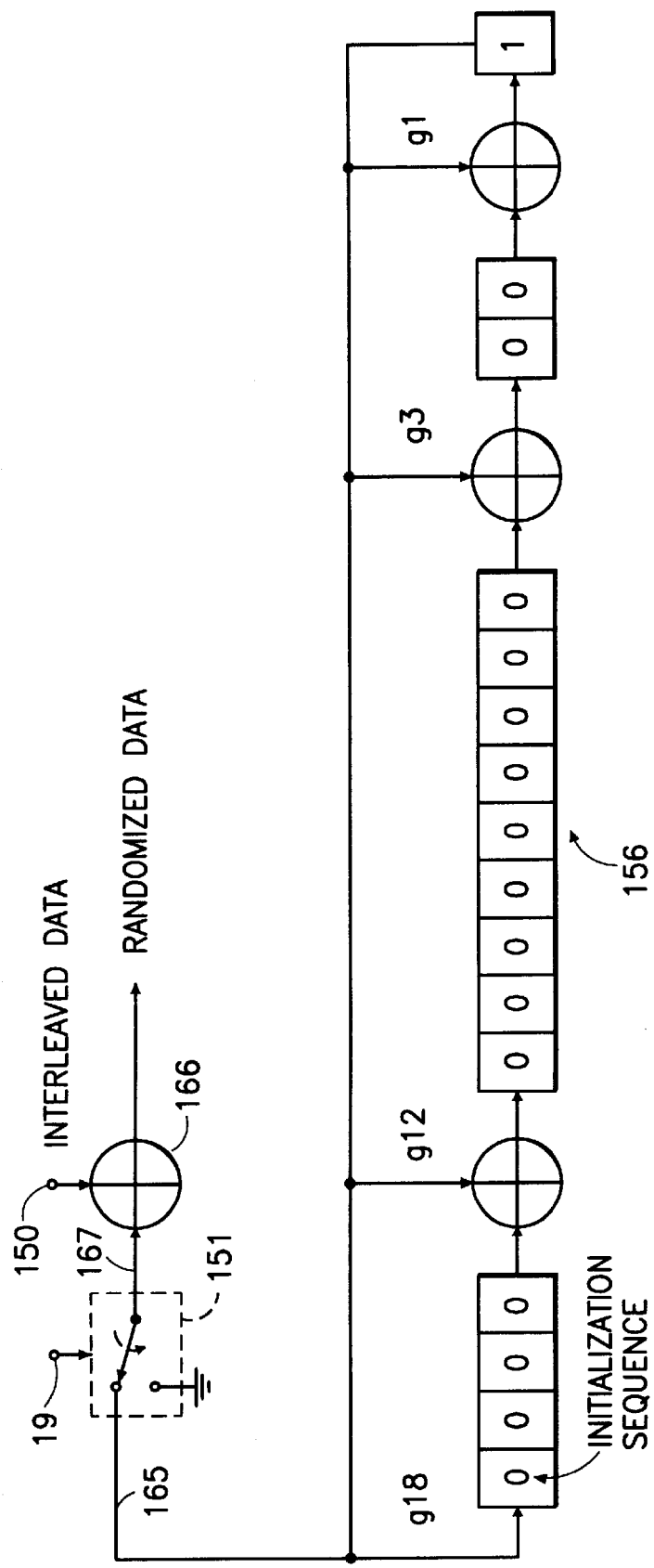
FIG. 6 is a block diagram of a randomizer that can be used in accordance with the present invention.

FIG. 6 illustrates an example of a randomizer that can be used in the encoder of FIG. 1. A similar structure can be used for the derandomizer illustrated in FIG. 2. The interleaved data output from interleaver 16 (FIG. 1) is input via terminal 150 and randomized (e.g., the value of some bits is changed without reordering the bitstream) via an exclusive -OR operation provided by gate 166 with a truncated $2^{16}-1$ maximal length pseudorandom (PN) sequence provided on line 165 that can be restarted, for example, every 24 Reed-Solomon encoder block intervals. As indicated above, the sixteen-bit substitute sync patterns occurring every twelve R/S block intervals are not randomized. The randomizer (and derandomizer) will be clocked during the sixteen-bit times that the substitute sync patterns are inserted, but the randomizer (derandomizer) output on line 165 will not be used in the exclusive -OR operation. Instead, a control signal input via terminal 19 will ground the exclusive -OR input 167 via switch 151 when the substitute sync patterns appear at terminal 150.

The PN sequence can be generated from, e.g., a sixteen stage linear feedback shift register 156 with taps at stages 16 (g16), 12 (g12), 3 (g3), and 1 (g1), as illustrated in FIG. 6. The randomizer input is defined as the PN randomization sequence.

The randomizer is initialized at the first bit following the concatenated substitute sync bytes output from the interleaver every twenty-four blocks. The derandomizer will be initialized at the first bit following the concatenated substitute sync pattern detected at the Viterbi decoder output.

Figure 7:
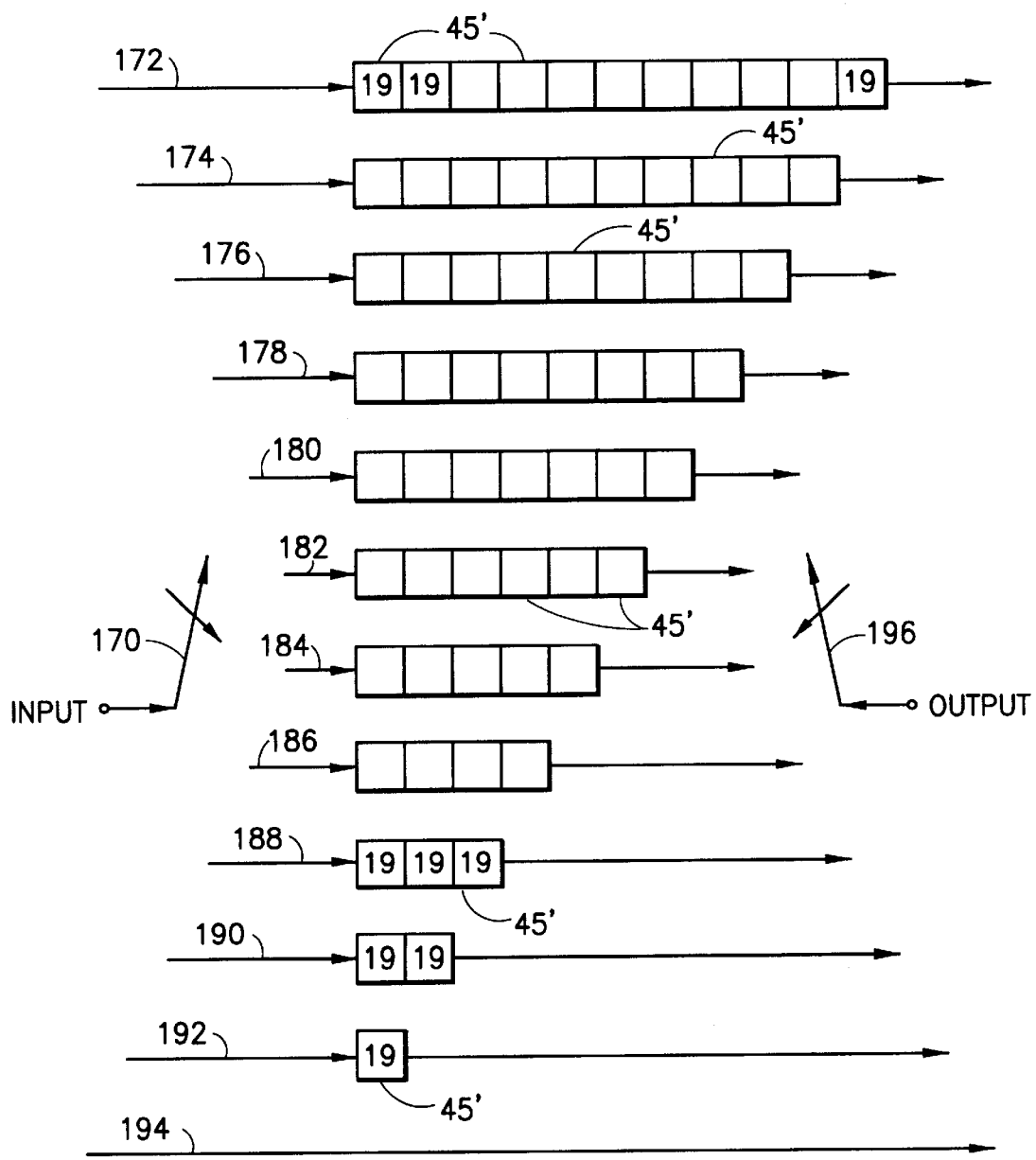
FIG. 7 is a block diagram of a convolutional deinterleaver useful in accordance with the present invention.

FIG. 7 illustrates an example of a convolutional deinterleaver that can be used in the decoder of FIG. 2. The deinterleaver is essentially the inverse of the interleaver illustrated in FIG. 3. A commutator arm 170 inputs the received bytes to a plurality of commutator arms 172, 174, 176 . . . 194. Nineteen-byte delay stages 45' are provided as shown. Commutator 196 is synchronized with commutator arm 170, and outputs the deinterleaved data.

Deinterleaver pointer alignment is initialized upon signal acquisition using the sync pattern formed by the concatenated sync bytes. Upon recognition of sync, the output from commutator arm 172 is read and the odd sync byte of the sync pattern is written into the buffer. The deinterleaver commutator advances to the next commutator arm, reads an output symbol, and shifts the next received byte into this arm's buffer. After the zero delay arm 194 has been read and written, the commutator arm advances to the top delay buffer (commutator arm 172) to continue the deinterleaving function. Pointer alignment is defined as the interleaver and deinterleaver both pointing to the same symbol.

It should now be appreciated that the present invention provides a method and apparatus for reordering transport packets in an MPEG-type transport stream to replace a conventional sync byte with a concatenated pair of substitute sync bytes. In addition, some of the conventional sync bytes are eliminated, enabling the transport of auxiliary information in the same bandwidth that would otherwise be used by the conventional sync bytes. Although the invention has been described in connection with a specific embodiment adapted for use with a particular interleaver depth, this embodiment is provided for illustration only and other implementations will be apparent for interleavers having other depths. Further, transport packets of different sizes will require the specific example provided herein to be modified without departing from the inventive concept. It will therefore be appreciated that numerous adaptations and modifications may be made to the illustrated embodiment without departing from the spirit and scope of the invention as set forth in the claims.

We claim:

1. A method for modifying a transport packet stream to provide concatenated synchronization bytes at an output of an interleaver receiving the modified transport packet stream, comprising the steps of:

replacing a conventional sync byte located in a first transport packet of said transport packet stream with a first substitute sync byte;

deleting a conventional sync byte located in a conventional sync byte position of a second transport packet of said transport packet stream, and moving another byte from said second transport packet to said conventional sync byte position, thereby opening a desired byte position in the second transport packet;

inserting a second substitute sync byte into said desired byte position; and selecting said first and second transport packets and said desired byte position to provide said first and second substitute sync bytes at locations in the modified transport packet stream where said first substitute sync byte will be concatenated with said second substitute sync byte at the output of said interleaver.

2. The method of claim 1 for further modifying said transport packet stream to provide concatenated auxiliary bytes at the output of said interleaver, comprising the steps of:

replacing a conventional sync byte located in a third transport packet with a first auxiliary byte;

deleting a conventional sync byte located in a conventional sync byte position of a fourth transport packet and moving another byte from said fourth transport packet to the conventional sync byte position of the fourth transport packet, thereby opening up a desired byte position in the fourth transport packet;

inserting a second auxiliary byte into the desired byte position of said fourth transport packet; and selecting said third and fourth transport packets and the desired byte position in the fourth transport packet to provide said first and second auxiliary bytes at positions in said modified packet stream where said first auxiliary byte will be concatenated with said second auxiliary byte at the output of said interleaver.

3. The method of claim 2 wherein said first and second transport packets are separated in the modified packet stream by a plurality of intervening packets, each of said intervening packets being one of:

a first modified packet having an auxiliary byte directly replacing a conventional sync byte therein, a second modified packet having an auxiliary byte in a desired byte position made available by replacing the conventional sync byte of the packet with another byte from that packet, a third modified packet having a substitute sync-byte directly replacing the conventional sync byte therein, a fourth modified packet having a substitute sync byte in a desired byte position made available by replacing the conventional sync byte of the packet with another byte from that packet.

4. The method of claim 3 wherein the conventional sync bytes that are replaced in said first and third transport packets are located at the beginning of the respective transport packet.

5. The method of claim 4 wherein said desired byte positions are made available by shifting a group of N contiguous bytes immediately following the conventional sync byte in the respective transport packet by one byte, so that said group will commence at the beginning of the respective transport packet, thereby opening up said desired byte position immediately following said group.

6. The method of claim 5 wherein the desired byte position selected during said selection step is based on an interleaver having a depth I=12, J=19.

7. The method of claim 6 wherein said second transport packet precedes said first transport packet with twelve intervening packets in between.

8. The method of claim 7 wherein:

the first intervening packet preceding said first transport packet is one of said fourth modified packets;

the second, fourth, sixth, eighth and tenth intervening packets preceding said first transport packet are each first modified packets;

the third, fifth, seventh, ninth and eleventh intervening packets preceding said first transport packet are each second modified packets; and the twelfth intervening packet preceding said first transport packet is one of said third modified packets.

9. The method of claim 8 wherein:

said transport packet stream is a Reed-Solomon encoded MPEG transport packet stream having packets that are 204 bytes in length; and said desired byte positions comprise the 144th byte in the respective packet.

10. The method of claim 2 wherein said packet stream is output from said interleaver as an interleaved, modified packet stream for subsequent communication via a communication channel, comprising the further step of:
- randomizing those portions of the interleaved, modified packet stream that do not include the concatenated first and second substitute sync bytes;
- wherein the concatenated substitute sync bytes are maintained in an unrandomized condition in an otherwise randomized packet stream.

11. A method for reconstructing said transport packet stream from the randomized packet stream of claim 10, comprising the steps of:
- detecting the concatenated first and second substitute sync bytes in the randomized packet stream;
- synchronizing a derandomizer and a deinterleaver using the detected concatenated substitute sync bytes;
- derandomizing the randomized portions of the randomized packet stream after said synchronizing step to recover the interleaved, modified packet stream;
- deinterleaving the recovered interleaved, modified packet stream to recover the modified packet stream;
- replacing the substitute sync byte and first auxiliary byte in said first and third transport packets of said modified packet stream with conventional sync bytes;
- moving bytes located in the conventional sync byte positions of said second and fourth transport packets of said modified packet stream to open up said conventional sync byte positions and close said desired byte positions; and
- inserting conventional sync bytes into the conventional sync byte positions opened up during said moving step.

12. The method of claim 1 wherein said packet stream is output from said interleaver as an interleaved, modified packet stream for subsequent communication via a communication channel, comprising the further step of:
- randomizing portions of the interleaved, modified packet stream that do not include the concatenated first and second substitute sync bytes for communication together with the unrandomized concatenated bytes in a randomized packet stream.

13. A method for reconstructing said transport packet stream from the randomized packet stream of claim 12, comprising the steps of:
- detecting the concatenated first and second substitute sync bytes in the randomized packet stream;
- synchronizing a derandomizer and a deinterleaver using the detected concatenated substitute sync bytes;
- derandomizing the randomized portions of the randomized packet stream after said synchronizing step to recover the interleaved, modified packet stream;
- deinterleaving the recovered interleaved, modified packet stream to recover the modified packet stream;
- replacing the substitute sync byte in said first transport packet of said modified packet stream with a conventional sync byte;
- moving the byte located in the conventional sync byte position of said second transport packet of said modified packet stream to open up said conventional sync byte position and close said desired byte position; and
- inserting a conventional sync byte into the conventional sync byte position opened up during said moving step.

14. A method for reconstructing said transport packet stream from an interleaved, modified packet stream provided in accordance with the method of claim 2, comprising the steps of:
- detecting the concatenated first and second substitute sync bytes in the interleaved, modified packet stream;
- synchronizing a deinterleaver using the detected concatenated substitute sync bytes;
- deinterleaving the interleaved, modified packet stream to recover the modified packet stream;
- replacing the substitute and auxiliary sync bytes in said first and third transport packets of said modified packet stream with a conventional sync byte;
- moving bytes located in the conventional sync byte positions of said second and fourth transport packets of said modified packet stream to open up said conventional sync byte positions and close said desired byte positions; and
- inserting conventional sync bytes into the conventional sync byte positions opened up during said moving step.

15. A method for reconstructing said transport packet stream from an interleaved, modified packet stream provided in accordance with the method of claim 1, comprising the steps of:
- detecting the concatenated first and second substitute sync bytes in the interleaved, modified packet stream;
- synchronizing a deinterleaver using the detected concatenated substitute sync bytes;
- deinterleaving the interleaved, modified packet stream to recover the modified packet stream;
- replacing the substitute sync byte in said first transport packet of said modified packet stream with a conventional sync byte;
- moving a byte located in the conventional sync byte position of said second transport packet of said modified packet stream to open up said conventional sync byte position and close said desired byte position; and
- inserting a conventional sync byte into the conventional sync byte position opened up during said moving step.

16. Apparatus for modifying a transport packet stream to provide concatenated synchronization bytes at an output of an interleaver receiving the modified packet stream, comprising:
- means coupled to receive said transport packet stream for locating particular byte positions in successive transport packets;
- means responsive to said locating means for replacing a conventional sync byte located in a first transport packet with a first substitute sync byte;
- means responsive to said locating means for deleting a conventional sync byte located in a conventional sync byte position of a second transport packet and moving another byte from said second transport packet to said conventional sync byte position, thereby opening a desired byte position in the second transport packet; and
- means responsive to said locating means for inserting a second substitute sync byte into said desired byte position;
- wherein said first and second transport packets and said desired byte position provide said first and second substitute sync bytes at locations in the modified packet stream where said first substitute sync byte will be concatenated with said second substitute sync byte at the output of said interleaver.

17. Apparatus in accordance with claim 16 further comprising:
- means responsive to said locating means for replacing a conventional sync byte located in a third transport packet with a first auxiliary byte;

means responsive to said locating means for deleting a conventional sync byte located in a conventional sync byte position of a fourth transport packet and moving another byte from said fourth transport packet to the conventional sync byte position of the fourth transport packet, thereby opening up a desired byte position in the fourth transport packet; and means responsive to said locating means for inserting a second auxiliary byte into the desired byte position of said fourth transport packet;

wherein said third and fourth transport packets and the desired byte position in the fourth transport packet provide said first and second auxiliary bytes at positions in said modified packet stream where said first auxiliary byte will be concatenated with said second auxiliary byte at the output of said interleaver.

18. Apparatus in accordance with claim 17 wherein:

said desired byte positions are made available by shifting a group of N contiguous bytes immediately following the conventional sync byte in the respective transport packet by one byte, so that said group will commence at the conventional sync byte position of the respective transport packet, thereby opening up said desired byte position immediately following said group.

19. Apparatus in accordance with claim 17 further comprising:

a data randomizer following said interleaver for randomizing only portions of interleaved output that do not include the concatenated first and second substitute sync bytes;

wherein the concatenated substitute sync bytes are maintained in an unrandomized condition with the randomized portions of interleaved output.

20. Apparatus in accordance with claim 16 further comprising:

a data randomizer following said interleaver for randomizing only portions of interleaved output that do not include the concatenated first and second substitute sync bytes;

wherein the concatenated substitute sync bytes are maintained in an unrandomized condition with the randomized portions of interleaved output.

21. Apparatus for reconstructing an original transport packet stream with conventional sync bytes from a modified transport packet stream in which interleaved, modified transport packets provide concatenated substitute sync bytes, comprising:

means for detecting said concatenated substitute sync bytes in the modified transport packet stream;

means responsive to the detected concatenated substitute sync bytes for synchronizing a deinterleaver, said deinterleaver being coupled to deinterleave the modified transport packets;

means for locating a first substitute sync byte in a conventional sync byte position of a first deinterleaved transport packet and replacing the first substitute sync byte with a first conventional sync byte;

means for locating a second substitute sync byte in a nonconventional sync byte position of a second deinterleaved transport packet and replacing the second substitute sync byte with another byte from said second deinterleaved transport packet to open up a conventional sync byte position in said second deinterleaved transport packet; and means for inserting a second conventional sync byte into the opened up conventional sync byte position of said second deinterleaved transport packet.

22. Apparatus in accordance with claim 21 further comprising:

a derandomizer for derandomizing portions of the modified transport packet stream prior to said deinterleaver; and means for synchronizing said derandomizer using the detected concatenated substitute sync bytes, said derandomizer being adapted to selectively derandomize randomized portions of the modified transport packet stream without attempting to derandomize said concatenated substitute sync bytes.

23. Apparatus in accordance with claim 21 further comprising:

means for locating a first auxiliary byte in a conventional sync byte position of a third deinterleaved transport packet and replacing the first auxiliary byte with a conventional sync byte;

means for locating a second auxiliary byte in a nonconventional sync byte position of a fourth deinterleaved transport packet and replacing the second auxiliary byte with another byte from the fourth deinterleaved transport packet to open up a conventional sync byte position in said fourth deinterleaved transport packet; and means for inserting a conventional sync byte into the opened up conventional sync byte position of said fourth deinterleaved transport packet.

* * * * *